United States Patent
Setty et al.

(10) Patent No.: US 6,963,256 B2
(45) Date of Patent: Nov. 8, 2005

(54) LOW COST SPLITTER (76) Inventors: Radhakrishnaiah Setty, 32 Monroe Pl., Staten Island, NY (US) 10314; Chen Lu, 63 Avenue V, Brooklyn, NY (US) 11223

( * ) Notice: Subject to any disclaimer, the term of this patent is extended or adjusted under 35 U.S.C. 154(b) by 45 days.

(21) Appl. No.: 10/811,798

(22) Filed: Mar. 29, 2004

(65) Prior Publication Data

US 2005/0212618 A1    Sep. 29, 2005

(51) Int. Cl.[7] .............................. H03H 7/38
(52) U.S. Cl. ..................... 333/131; 333/118
(58) Field of Search .................. 333/131, 118, 119

(56) References Cited

U.S. PATENT DOCUMENTS

| | | | | |
|---|---|---|---|---|
| 3,349,345 A | * | 10/1967 | Winegard | 333/131 |
| 4,817,189 A | * | 3/1989 | Pfizenmaier et al. | 375/258 |
| 5,006,822 A | * | 4/1991 | Reddy | 333/112 |
| 5,495,212 A | * | 2/1996 | DeCramer | 333/25 |
| 5,742,213 A | * | 4/1998 | Reynolds | 333/131 |
| 5,752,181 A | * | 5/1998 | Vice | 455/326 |
| 6,111,465 A | * | 8/2000 | Kakuta et al. | 330/276 |
| 6,114,924 A | * | 9/2000 | Cain et al. | 333/112 |
| 6,222,733 B1 | * | 4/2001 | Gammenthaler | 361/705 |
| 6,281,779 B1 | * | 8/2001 | Matsumoto et al. | 336/200 |
| 6,542,047 B2 | * | 4/2003 | Chen et al. | 333/119 |
| 6,784,521 B2 | * | 8/2004 | Setty et al. | 257/662 |
| 6,806,790 B2 | * | 10/2004 | Ji | 333/119 |
| 2002/0186096 A1 | * | 12/2002 | Zheng et al. | 333/131 |
| 2003/0151136 A1 | * | 8/2003 | Ji | 257/724 |

* cited by examiner

*Primary Examiner*—Robert Pascal
*Assistant Examiner*—Kimberly E. Glenn
(74) *Attorney, Agent, or Firm*—Kevin Redmond (57) ABSTRACT

A low cost power splitter that has a small size and can be used with automated surface mount manufacturing equipment. The power splitter includes a case having a cavity and a lead mounting surface. Leads are secured to the lead mounting surface. A substrate is mounted in the cavity. The substrate has top surface, a bottom surface and inner layers. A resistor is formed on the top surface. A capacitor is formed on the inner layers. Terminals are located on the top surface and vias extend through the substrate. A pair of transformers are attached to the bottom surface and to the case by an adhesive. The transformers have windings that are connected to the terminals. Connector wires are connected between the terminals and the leads.

20 Claims, 10 Drawing Sheets

LOW COST SPLITTER

BACKGROUND

1. Field of the Invention

This invention relates to power splitters used with RF and microwave frequency signals in general and more particularly to a power splitter having a small package size that can be manufactured at low cost.

2. Description of the Related Art

Power splitters operating at frequencies up to 3 GHz have been made with ferrite transformers along with resistors and capacitors arranged around the ferrite transformers. When the frequency range starts below 10 MHz, two ferrite cores are necessary to achieve the desired electrical performance. The power splitter components typically use chip resistors and chip capacitors packaged on a circuit board.

Figure 1:
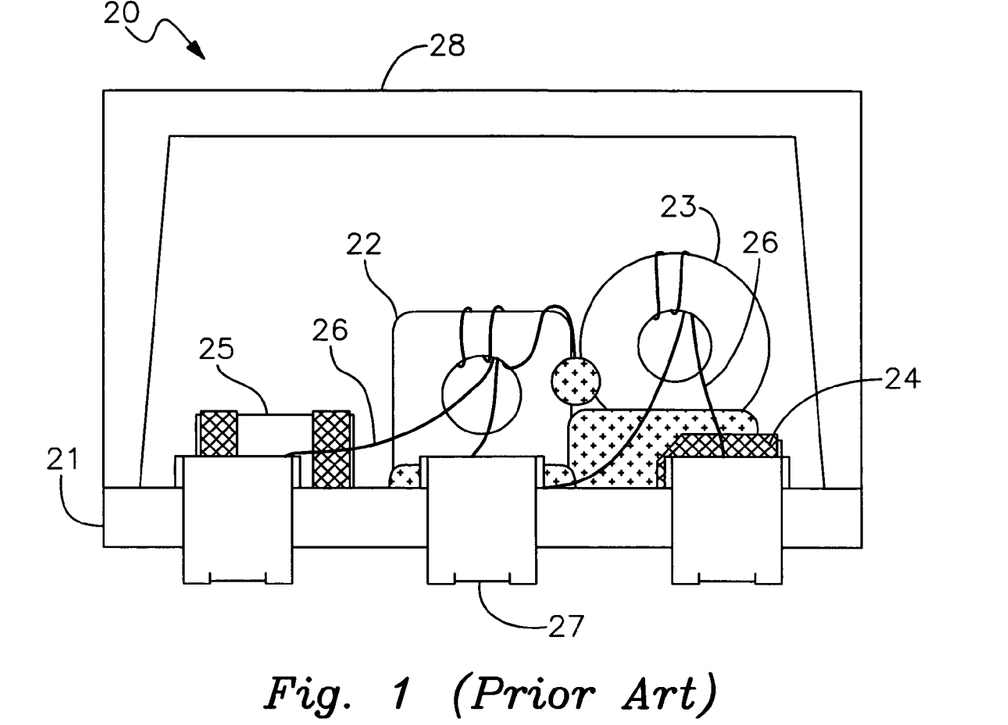
FIG. 1 is a side cross-sectional view of a prior art power splitter package.

Referring to FIG. 1, a prior art power splitter package is shown. Power splitter package 20 has a circuit board 21 upon which are mounted a pair of single core transformers 22 and 23. A chip resistor 24 and chip capacitor 25 are soldered onto circuit board 21 to one side of the transformers 22 and 23. Transformer wires 26 are attached to leads 27. A cover 28 is required to be placed over circuit board 21. The cover is required in order to protect the splitter components and to provide a surface for an automated surface mount machine to grasp and pickup the power splitter.

Unfortunately, placing the resistors and capacitors beside each transformer increases the size or footprint of the power splitter package and also complicates the assembly process. The mounting of the cover adds additional process steps and the expense of the cover. The use of the cover also reduces the ability to cool the power splitter. The cover causes the power splitter package to have a large height, which is undesirable in many applications. The cover can also trap liquids used during the manufacturing process possibly leading to increased corrosion or failure.

While power splitters have been used, they have suffered from being too large, difficult to assemble and are not easily used with automated surface mount equipment. A current unmet need exists for a power splitter that has a smaller size, can be assembled at a low cost and that can be used with automated surface mount equipment.

SUMMARY

It is a feature of the invention to provide a power splitter having a small package size that has improved electrical characteristics.

Another feature of the invention is to provide an electronic package for a power splitter that can be used with automated surface mount manufacturing equipment.

Another feature of the invention is to provide a power splitter that takes up less printed circuit board space and has improved electrical repeatability.

A further feature of the invention is to provide a method of manufacturing a low cost power splitter.

A further feature of the invention is to provide an electronic package for a power splitter that includes a case having a cavity, a top surface and a lead mounting surface. The cavity defines four walls and a bottom surface. The cavity is exposed in order to provide access to the cavity.

Leads are secured to the lead mounting surface on two of the walls. The leads have a proxil end attached to the lead mounting surface and a distal end that extends outwardly from the case and downwardly away from the lead mounting surface. Each lead has a lead extension which is embedded in one of the walls in order to secure the lead to the case.

A substrate is mounted within the cavity and is surrounded by the walls. The substrate includes a first end, a second end, a top surface, a bottom surface and a plurality of inner layers. A film resistor is formed on the top surface. A capacitor is formed on the inner layers. Terminals are located on the top surface and vias extend through the substrate between the top surface and the bottom surface. The vias electrically connect the resistor, the capacitor and the terminals.

A first transformer is attached to the bottom surface of the substrate at the first end. The first transformer has a first winding. The first winding extends from the first transformer on the bottom surface to the terminals on the top surface. The first winding is electrically connected to the terminals. A second transformer is attached to the bottom surface of the substrate at the second end. The second transformer has a second winding. The second winding extends from the second transformer on the bottom surface to the terminals on the top surface. The second winding is electrically connected to the terminals. The first and second transformers are attached to the bottom surface of the case by an adhesive. Several connector wires are connected between the terminals and the leads.

BRIEF DESCRIPTION OF THE DRAWINGS

It is noted that the drawings of the invention are not to scale.

DETAILED DESCRIPTION

Figure 2:
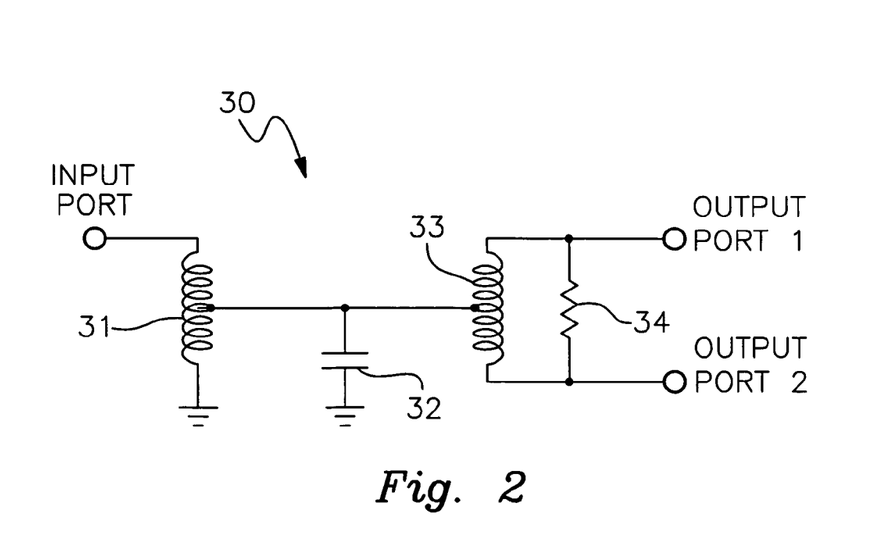
FIG. 2 is an electrical schematic of a power splitter.

Referring to FIG. 2, a schematic diagram of a power splitter circuit 30 is shown. Power splitter 30 has an input port connected to a transformer 31. One end of the transformer 31 is connected to ground. A capacitor 32 is connected between a midpoint of transformer 31 and to ground. Another transformer 33 has a midpoint connected to capacitor 32. Transformer 33 has one end connected to output port 1 and another end connected to output port 2. A resistor 34 is connected between output ports 1 and 2. A signal applied to the input port is equally split into two signals at the output ports 1 and 2. Transformer 33 splits the input signal. Transformer 31 and capacitor 32 provide impedance matching to the input port. Capacitor 32 is required to match the reactive part of the impedance. The resistor 34 plays an important role in providing isolation between the two output ports 1 and 2. Power splitter 30 is a 2 way power splitter since the input signal is split into two output signals.

Referring to FIGS. 3–6, the electrical schematic of the power splitter of FIG. 2 is realized in a physical package. Power splitter 100 has a case 102 having a cavity 103. Case 102 has outer surfaces 104, 105, a top surface 106, and a lead mounting surface 108. Case 102 has a length, a height and a width. Cavity 103 defines four walls 112 and a bottom surface 110. Cavity 103 is exposed in order to provide access to the cavity. The case can be formed from an insulative material such as plastic. Six metal leads 120 are secured to the lead mounting surface 108 adjacent to outer surface 105. The leads include leads 120A, 120B, 120C, 120D, 120E and 120F. The leads have a proxil end 124 that is attached to the lead mounting surface 108 and a distal end 122 that extends outwardly from the case outer surface 105. Distal end 122 also extends downwardly away from the lead mounting surface 108. Leads 120 have a lead extension 126 which is embedded into wall 112 in order to secure the lead to the case. Further details on the construction of case 102 can be found in U.S. Pat. No. 6,133,525, the contents of which are herein incorporated by reference in entirety.

Figure 6:
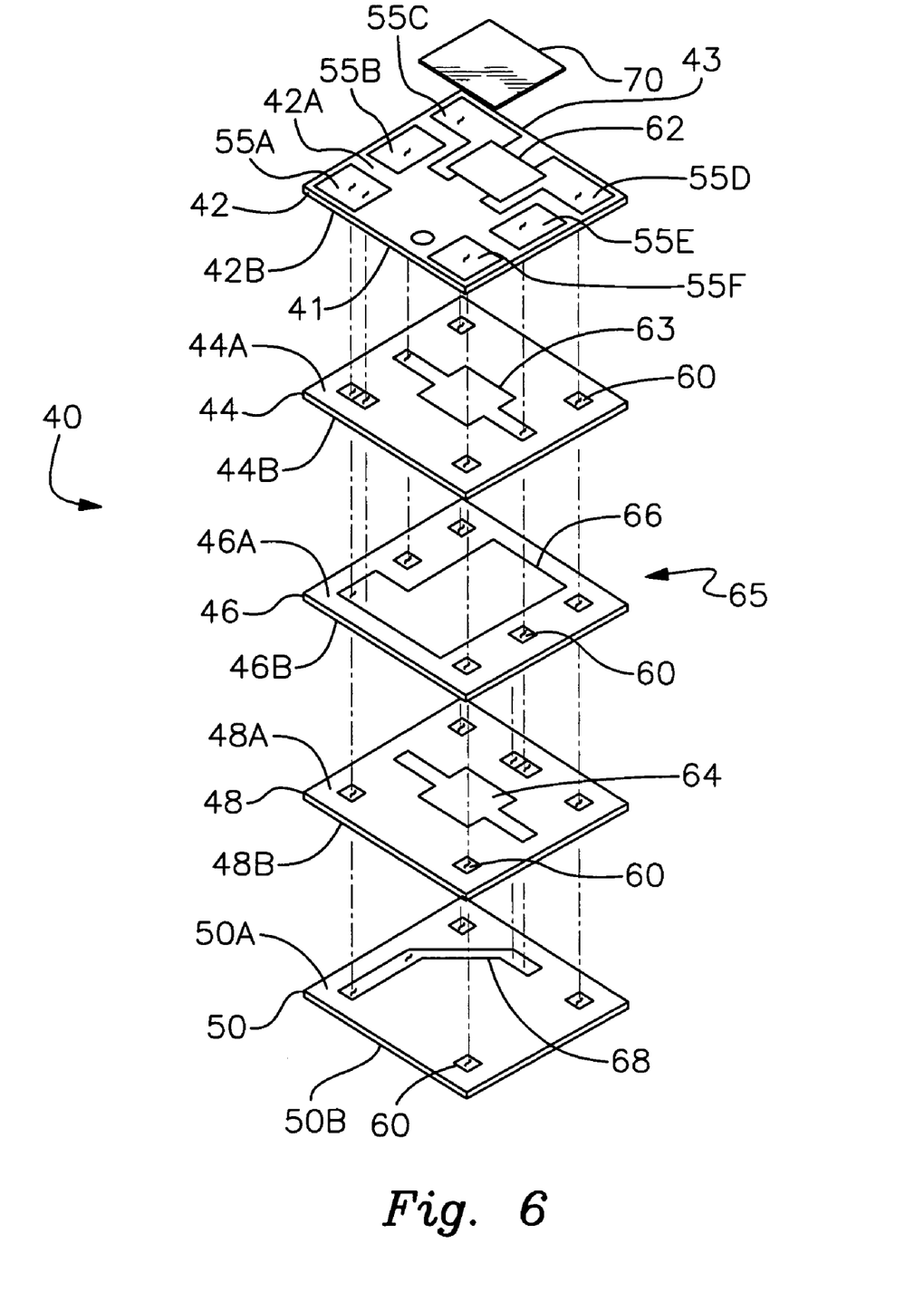
FIG. 6 is an exploded view of the substrate of the present invention.

FIG. 6 shows a low temperature co-fired ceramic (LTCC) substrate 40. Substrate 40 has ends 41 and 43. LTCC substrate 40 is comprised of multiple layers of low temperature co-fired ceramic material. Planar layers 42, 44, 46, 48 and 50 are all stacked on top of each other and form a unitary structure 40 after firing in an oven. LTCC layers 42–50 are commercially available in the form of a green unfired tape from Dupont Corporation. Each of the layers has a top surface, 42A, 44A, 46A, 48A and 50A. Similarly, each of the layers has a bottom surface, 42B, 44B, 46B, 48B and 50B.

The layers have several circuit features that are patterned on the top surfaces. Multiple vias 60 extend through each of the layers. Vias 60 are formed from an electrically conductive material and electrically connect one layer to another layer. Layer 42 has several circuit features that are patterned on surface 42A. Surface 42A has six terminals 55 and a film resistor 62. Terminals 55 include terminal 55A, 55B, 55C, 55D, 55E and 55F. One of the terminals 55 forms an input port. Two of the terminals 55 form output ports 1 and 2. The terminals are electrically connected to vias 60. The resistor 62 has a protective insulative overglaze 70 to protect the resistor from abrasion and shorting. Layer 44 has an upper capacitor electrode 63 formed on surface 44A. The upper electrode 63 is connected on two sides to a via 60. Layer 46 has a ground plane 66 formed on surface 46A. The ground plane 66 is connected on two sides to a via 60. Layer 48 has a lower capacitor electrode 64 formed on surface 48A. The lower electrode 64 is connected on two sides to a via 60. The upper and lower electrodes and the insulative LTCC layers in between form a capacitor 65. Layer 50 has a circuit line 68 formed on surface 50A. The circuit line 68 is connected at the ends and the middle to vias 60. Further details on the construction of substrate 40 can be found in U.S. patent publication No. 2002/0186,096 the contents of which are herein incorporated by reference in entirety.

Figure 3:
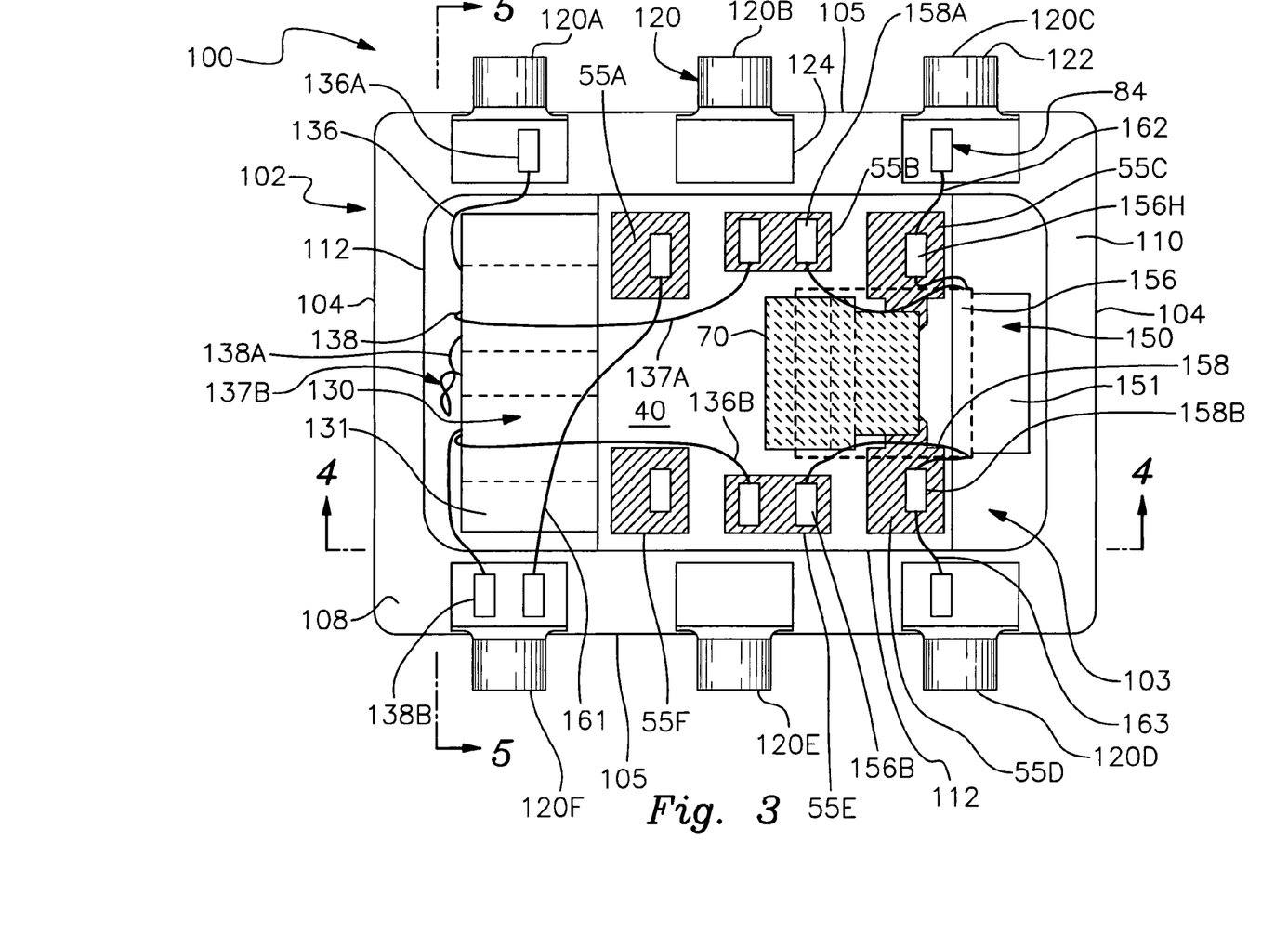
FIG. 3 is a top assembled view of a low cost power splitter in accordance with the present invention.
Figure 4:
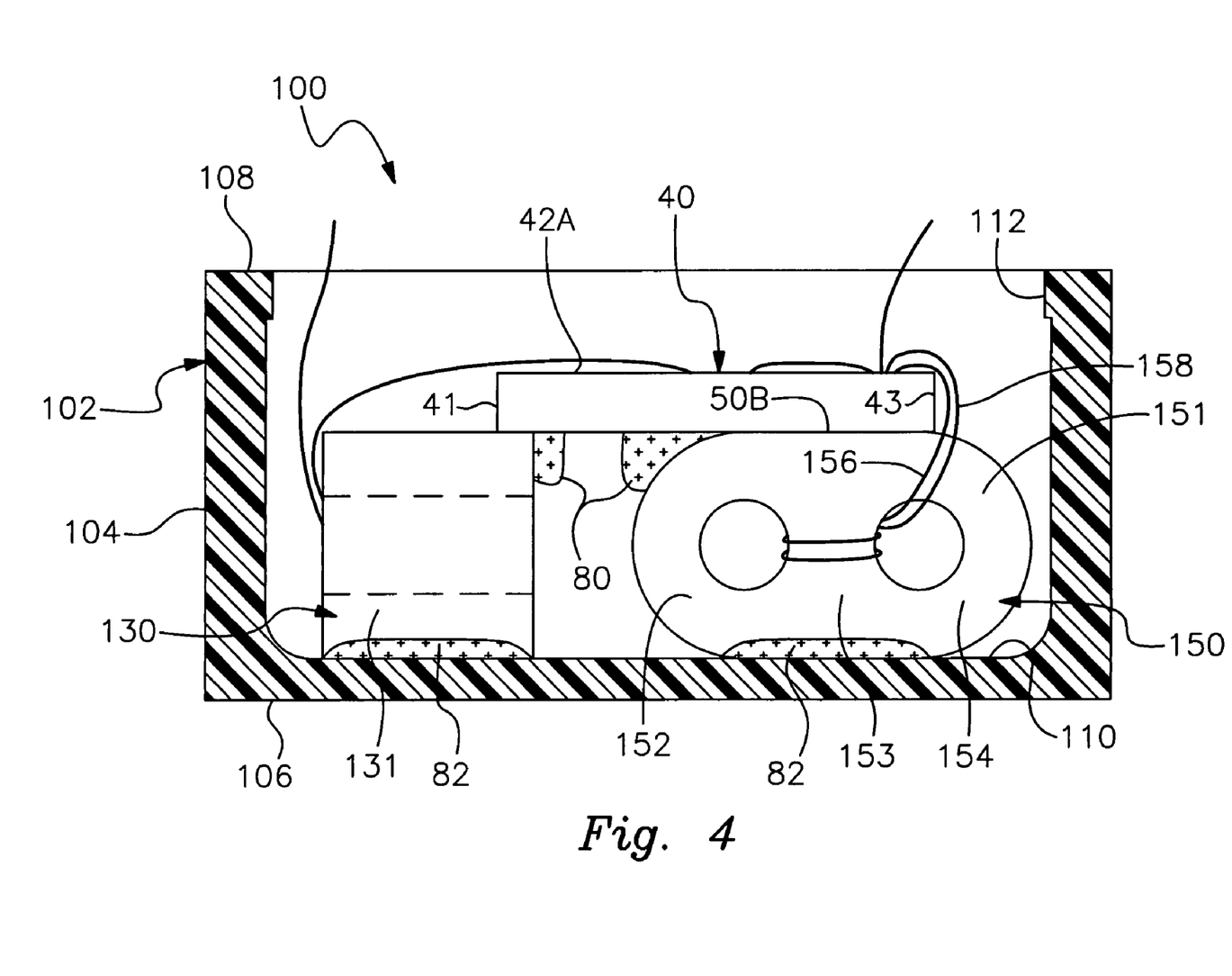
FIG. 4 is a side cross-sectional view of FIG. 3 along section line 4—4.
Figure 5:
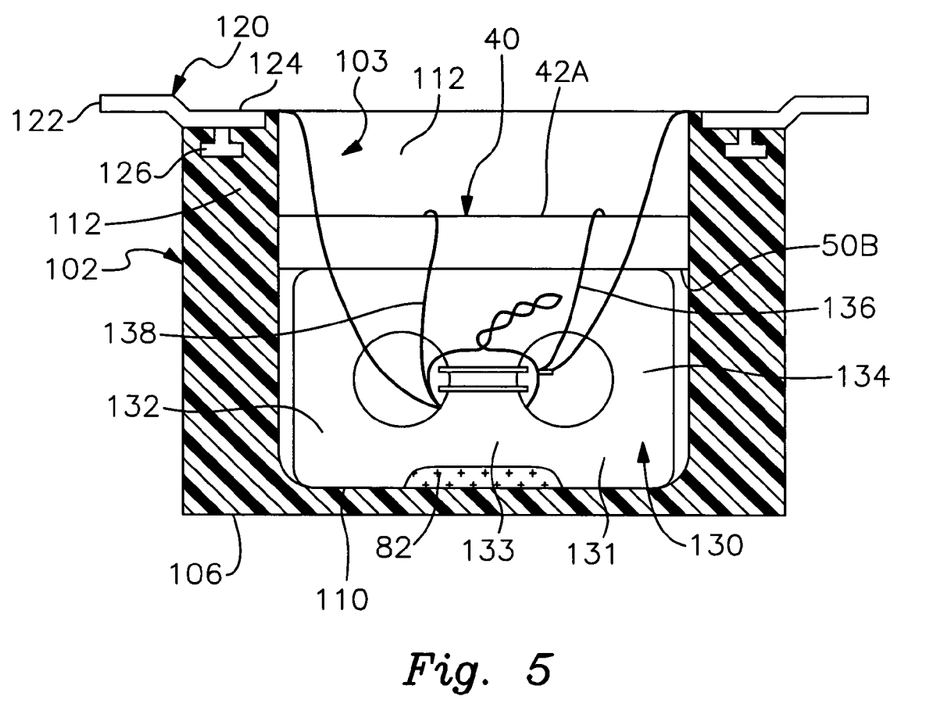
FIG. 5 is another side cross-sectional view of FIG. 3 along section line 5—5.

Turning now to FIGS. 3, 4 and 5, transformers 130 and 150 are mounted to substrate 40. The transformers perform the power splitting and matching functions. Transformer 130 is mounted to surface 50B at end 41 by an adhesive 80. Transformer 150 is mounted to surface 50B at end 43 by an adhesive 80. Adhesive 80 can be an epoxy or other suitable glue. Transformer 130 has a ferrite binocular core 131 with three legs 132, 133 and 134. Transformer 150 has a ferrite binocular core 151 with three legs 152, 153 and 154.

Transformer 130 has three wire windings 136, 137 and 138. Transformer 130 has a core 131 with outer legs 132, 134 and a middle leg 133. Wire winding 136 has ends 136A and 136B. Wire winding 137 has ends 137A and 137B. Wire winding 138 has ends 138A and 138B. Windings 136, 137 and 138 are wound around middle leg 133. The wire ends are attached to leads 120 and terminals 55 by welds 84. End 136A is connected to lead 120A. End 136B is connected to terminal 55E. End 137A is connected to terminal 55B. End 137B is connected to end 138A by soldering. End 138B is connected to lead 120F.

Transformer 150 has a pair of wire windings 156 and 158. Transformer 150 has a core 151 with outer legs 152, 154 and a middle leg 153. Wire winding 156 has ends 156A and 156B. Wire winding 158 has ends 158A and 158B. Windings 156 and 158 are wound around middle leg 153. The wire ends are attached to terminals 55 by welding. End 156A is connected to terminal 55C. End 156B is connected to terminal 55E. End 158B is connected to terminal 55D. End 158A is connected to terminal 55B.

Substrate 40 is located within cavity 103. Surface 42A faces upwardly and is exposed. Surface 50B faces toward bottom surface 110. Transformers 130 and 150 are further mounted to bottom surface 110 of case 102 by adhesive 82. Adhesive 82 can be an epoxy or other suitable glue. Adhesive 82 holds the transformers, which hold substrate 40. Several connector wires are connected between the terminals and the leads. Connector wire 161 is connected between terminal 55A and lead 120F. Connector wire 162 is connected between terminal 55C and lead 120C. Connector wire 163 is connected between terminal 55D and lead 120D.

The power splitter 100 would be mounted to a printed circuit board (not shown). The leads 120 would be attached to the printed circuit board using a reflowed solder paste. The leads are bent such that distal end 122 would extend down to and contact the printed circuit board. Solder paste would be screen printed onto the printed circuit board. Ends 122 would be placed onto the solder paste and melted in a re-flow oven to attach the power splitter package to the printed circuit board.

Power splitter 100 can be assembled in the following manner:

1. Dispensing an adhesive 82 onto the bottom surface 110 of the case.
2. Transformers 130 and 150 with windings are placed onto adhesive 82 and cured.
3. Adhesive 80 is dispensed onto the top of transformers 130 and 150.
4. Substrate 40 is placed on adhesive 80 and cured.
5. Wire welding the appropriate windings to terminals 55 and leads 120.
6. Attaching connecting wires 161, 162 and 163 between the leads and the terminals.
7. Electrically testing the completed assembly.

Power splitter 100 can be used to make 4-way and 8-way splitters as well as higher order splitters. Since power splitter 100 is a 2-way power splitter, the 2-way splitter is cascaded to form 4-way and 8-way power splitters. Multiple power splitters 100 would be mounted side by side on a printed circuit board. Although this technique is well known there are several advantages of cascading power splitter 100. First, the small size of power splitter 100 makes cascading practical because the higher order splitter is still very small. It is still possible to fit multiple splitters 100 used in 4 & 8-way splitters in a small space. Second, using the same 2-way splitter repeatedly in high volume reduces cost because the same splitter parts can be bought in large volume and at reduced cost.

The present invention has several advantages. Since, the resistor 62 and capacitor 65 are integrated into the low temperature co-fired ceramic substrate, they do not have to be mounted separately adjacent to a transformer. This allows for a smaller package that can be assembled faster at lower cost. Fabricating the power splitter using a low temperature co-fired ceramic substrate results in more uniform electrical characteristics in the power splitter.

Another advantage of the present invention is that it eliminates the need for a separate cover. Since the case 102 is mounted with cavity 103 facing downward onto a printed circuit board, a separate cover is not needed. The mounting of the cover adds additional process steps and the expense of the cover itself.

A further advantage of the present invention is improved electrical performance.

Another advantage of the present invention is that the case allows an automated surface mount machine to grasp the outer surface of the case during assembly processing. Automated assembly reduces the cost of manufacturing the end product.

Omitting a cover improves cooling by exposing the power splitter to ambient air. Eliminating the cover prevents the trapping of liquids used during the manufacturing process that may be corrosive.

A further advantage of the present invention is that the combination of mounting substrate 40 within case 102 results in a power splitter package that has a very low overall height, which is very desirable in many applications.

Figure 7:
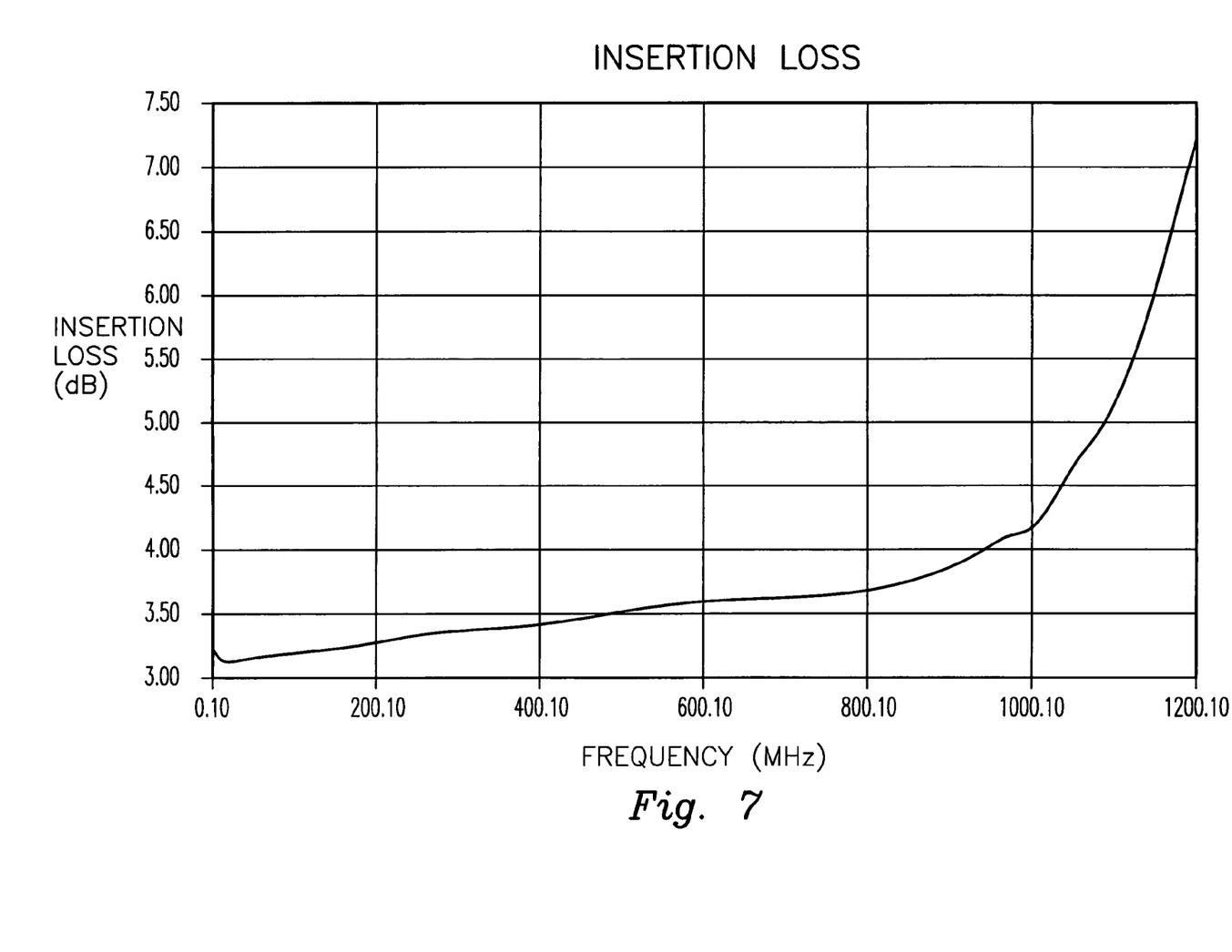
FIG. 7 is a graph showing insertion loss versus frequency for the power splitter of FIG. 3.
Figure 8:
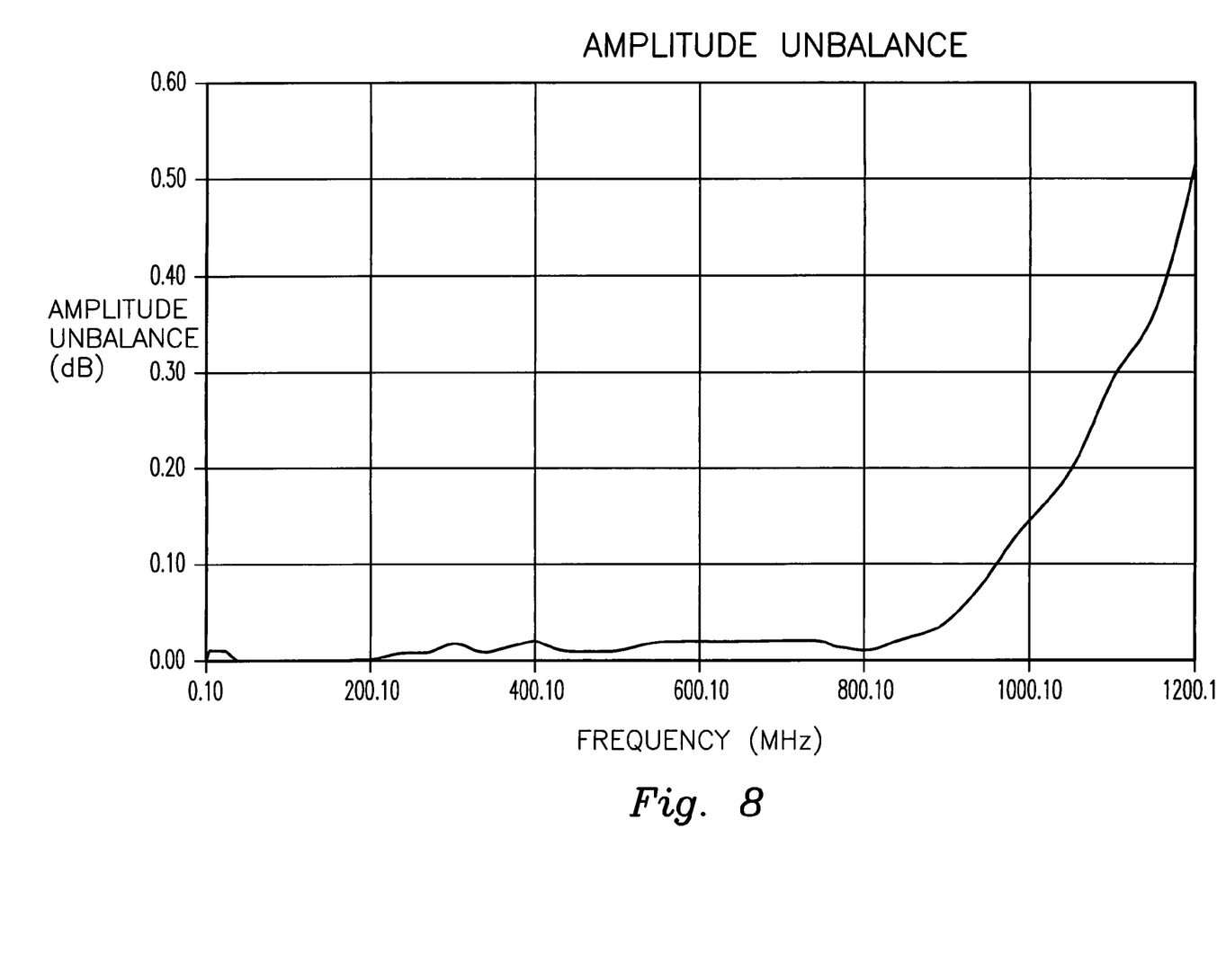
FIG. 8 is a graph showing amplitude imbalance versus frequency for the power splitter of FIG. 3.

Referring to FIG. 7, a graph showing the insertion loss for power splitter 100 is shown for frequencies from 0 to 1200 MHz. FIG. 8 shows a graph of amplitude unbalance versus frequency for power splitter 100. Amplitude unbalance is the difference of output power between output ports 1 and 2.

Figure 9:
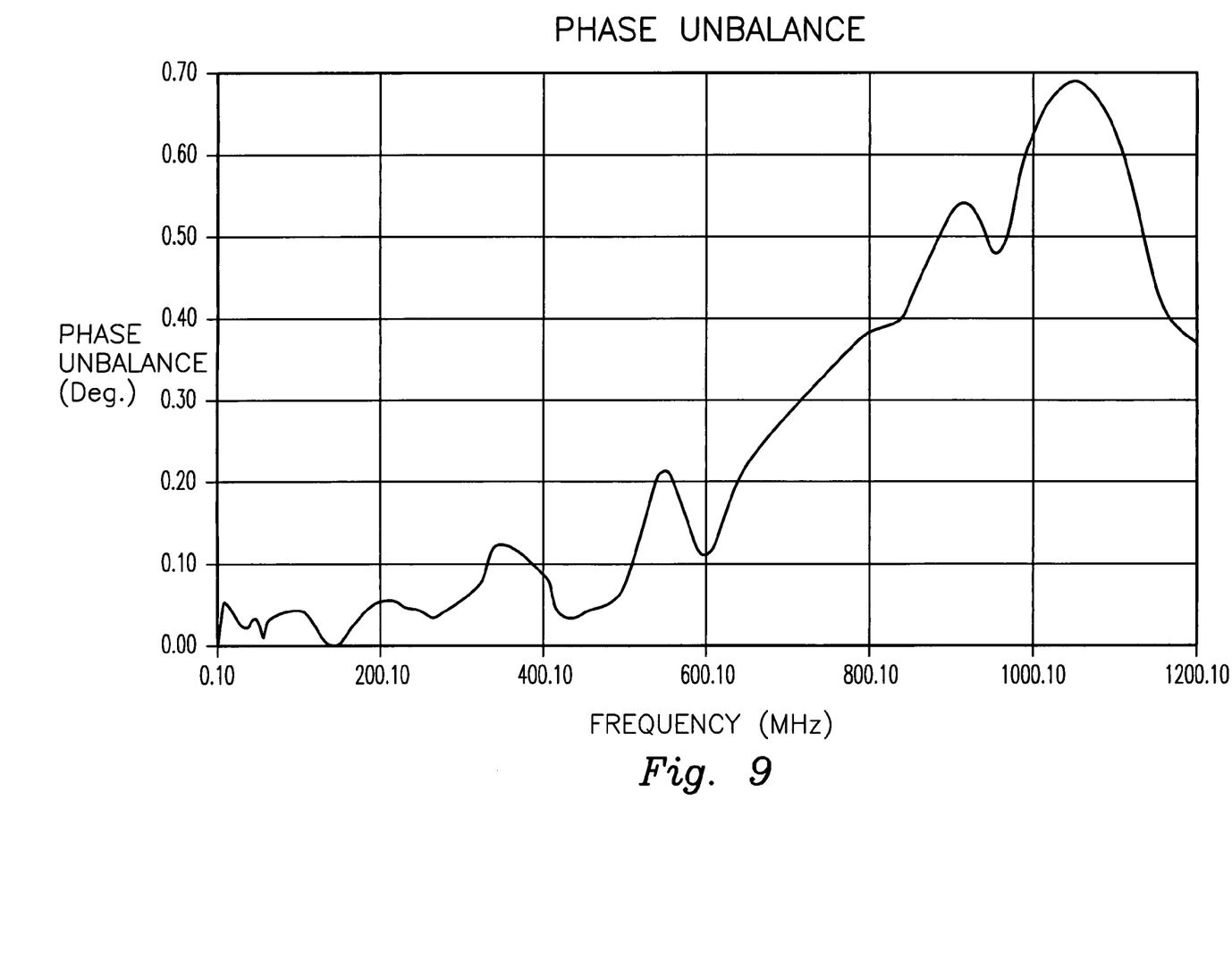
FIG. 9 is a graph showing phase unbalance versus frequency for the power splitter of FIG. 3.
Figure 10:
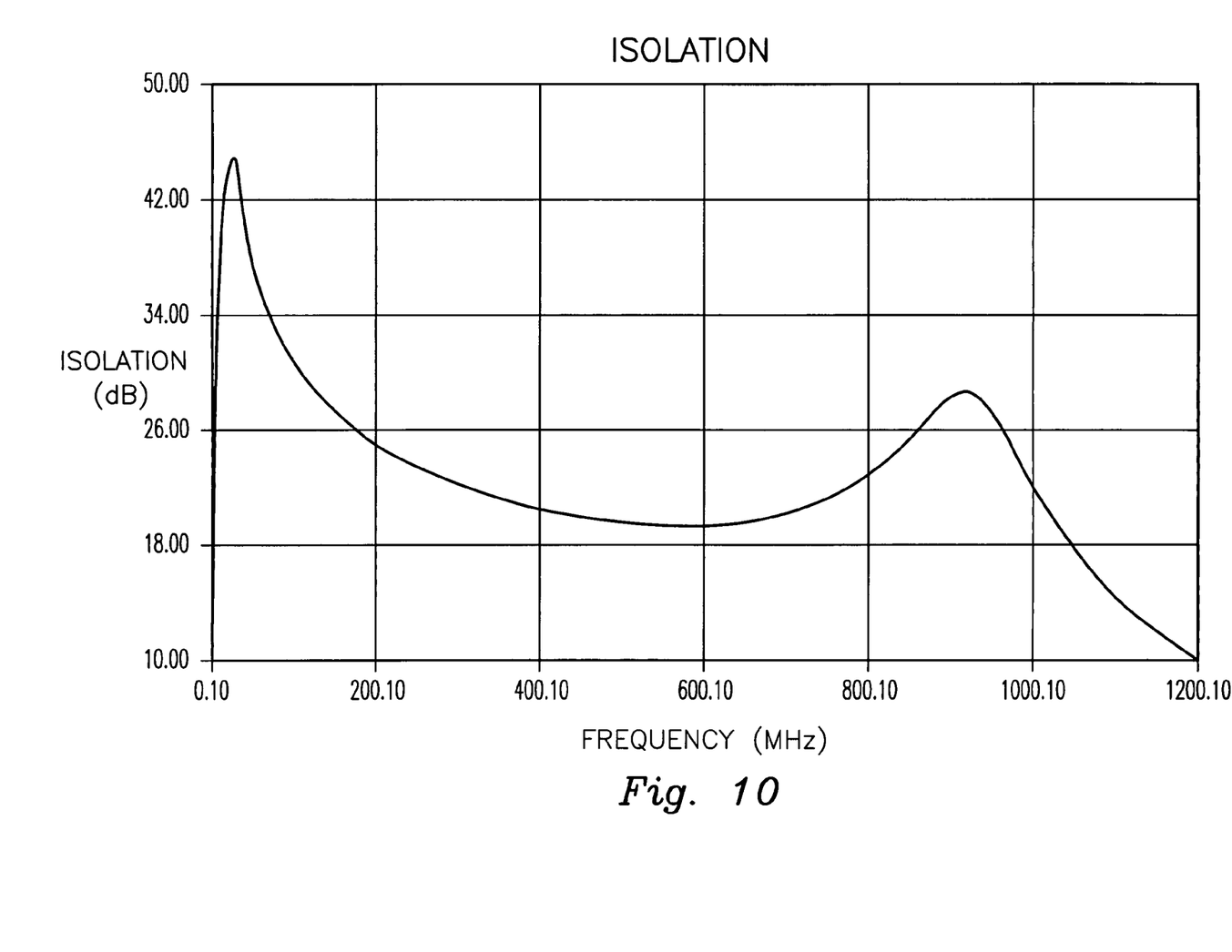
FIG. 10 is a graph showing isolation versus frequency for the power splitter of FIG. 3.
Figure 11:
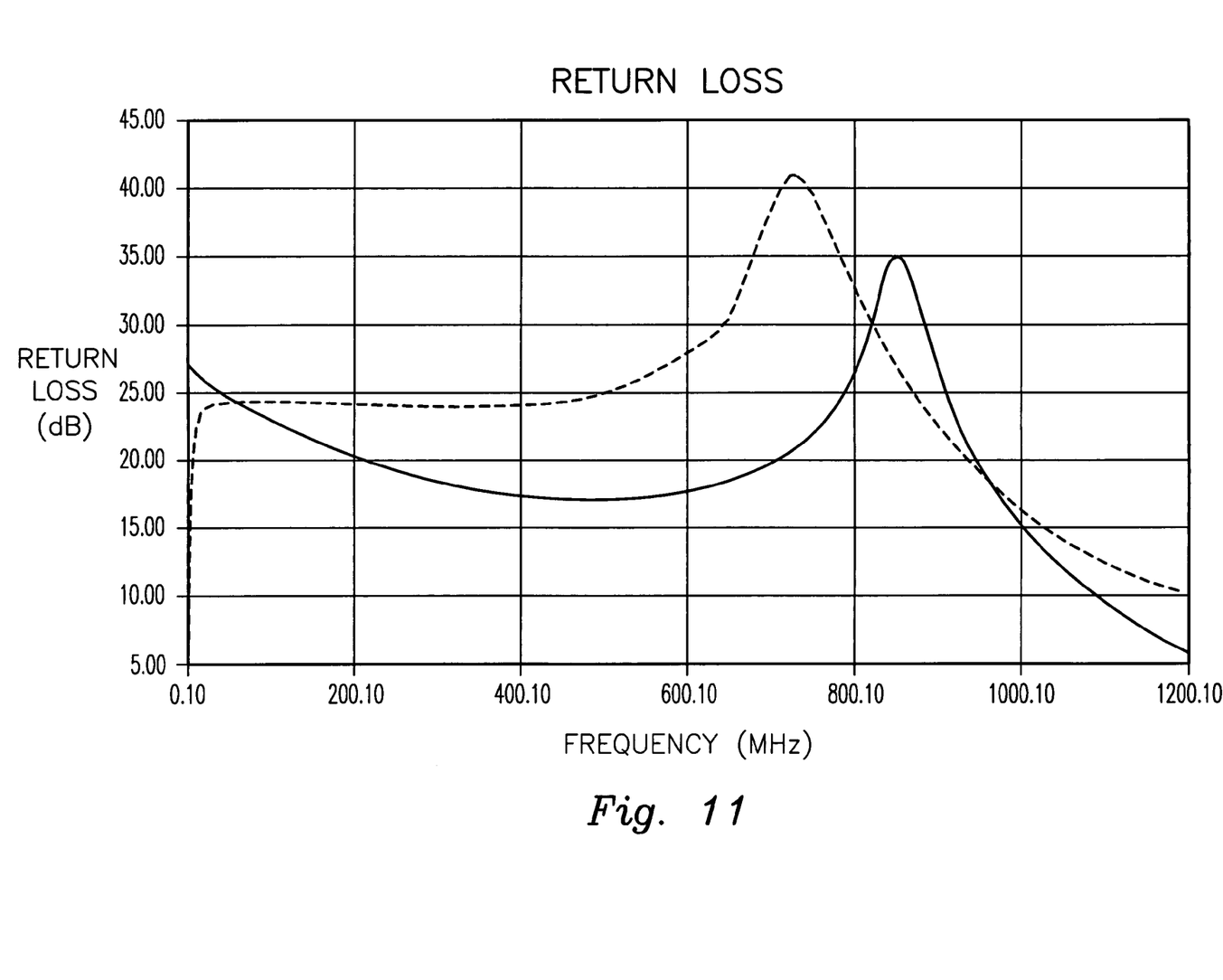
FIG. 11 is a graph showing return loss versus frequency at the input and output ports for the power splitter of FIG. 3.

FIG. 9 is a graph showing phase unbalance versus frequency for the power splitter. FIG. 10 shows a graph of isolation versus frequency for the power splitter between the output ports 1 and 2. FIG. 11 shows a graph of return loss versus frequency for the power splitter. The return loss at the input port and output ports are shown.

While the invention has been taught with specific reference to these embodiments, someone skilled in the art will recognize that changes can be made in form and detail without departing from the spirit and the scope of the invention. The described embodiments are to be considered in all respects only as illustrative and not restrictive. The scope of the invention is, therefore, indicated by the appended claims rather than by the description. All changes that come within the meaning and range of equivalency of the claims are to be embraced within their scope.

What is claimed is:

1. A power splitter comprising:
  a) a substrate having a top layer, a bottom layer, and a plurality of inner layers;
  b) a resistor formed on the top layer;
  c) a capacitor formed between one of the inner layers;
  d) a plurality of terminals located on the top layer;
  e) a plurality of vias extending through the substrate, the vias electrically connecting the resistor, the capacitor and the terminals;
  f) a first transformer attached to the bottom layer, the first transformer having a first winding, the first winding extending from the first transformer on the bottom layer to the terminals on the top surface, the first winding electrically connected to the terminals;
  g) a second transformer attached to the bottom layer, the second transformer having a second winding, the second winding extending from the second transformer on the bottom layer to the terminals on the top surface, the second winding electrically connected to the terminals;
  h) a case having a cavity, a top surface and a lead mounting surface, the cavity defining four walls and a bottom surface, the cavity being exposed in order to provide access to the cavity;
  i) a plurality of leads secured to the lead mounting surface, the leads having a proxil end attached to the lead mounting surface and a distal end that extends outwardly from the case and downwardly away from the lead mounting surface, each lead including a lead extension which is embedded in one of the walls in order to secure the lead to the case;
  j) the substrate mounted within the cavity such that the first and second transformers are attached to the bottom surface; and
  k) a plurality of connector wires connected between the terminals and the leads.

2. The power splitter according to claim 1 wherein the substrate is formed from layers of low temperature co-fired ceramic.

3. The power splitter according to claim 1 wherein the first transformer has a first binocular core and the second transformer has a second binocular core.

4. The power splitter according to claim 1 wherein the transformers are attached to the bottom layer of the substrate using an adhesive.

5. The power splitter according to claim 1 wherein the transformers are attached to the bottom surface of the case using an adhesive.

6. The power splitter according to claim 1 wherein the windings are electrically connected to the terminals by a plurality of welds.

7. The power splitter according to claim 1 wherein the connector wires are electrically connected to the leads by a plurality of welds.

8. The power splitter according to claim 1 wherein the case is adapted to be grasped by an automated machine.

9. The power splitter according to claim 1 wherein the capacitor has a first electrode formed on one of the inner layers and a second electrode formed on another of the inner layers.

10. An electronic package for a power splitter comprising:
  a) a case having a cavity, a top surface and a lead mounting surface, the cavity defining four walls and a bottom surface, the cavity being exposed in order to provide access to the cavity;
  b) a plurality of leads secured to the lead mounting surface on two of the walls, the leads having a proxil end attached to the lead mounting surface and a distal end that extends outwardly from the case and downwardly away from the lead mounting surface, each lead including a lead extension which is embedded in one of the walls in order to secure the lead to the case;
  c) a multi layered substrate mounted within the cavity and surrounded by the walls, the substrate including a first end, a second end, a top surface, a bottom surface and a plurality of inner layers, a film resistor being formed on the top surface, a capacitor formed on the inner layers, a plurality of terminals located on the top surface and a plurality of vias extending through the substrate between the top surface and the bottom surface, the vias electrically connecting the resistor, the capacitor and the terminals;

d) a first transformer attached to the bottom surface of the substrate at the first end, the first transformer having a first winding, the first winding extending from the first transformer on the bottom surface to the terminals on the top surface, the first winding electrically connected to the terminals;

e) a second transformer attached to the bottom surface of the substrate at the second end, the second transformer having a second winding, the second winding extending from the second transformer on the bottom surface to the terminals on the top surface, the second winding electrically connected to the terminals;

f) the first and second transformers attached to the bottom surface of the case by an adhesive; and g) a plurality of connector wires connected between the terminals and the leads.

11. The power splitter according to claim 10 wherein the first transformer has a first binocular core having a first leg, a middle leg and a third leg and the second transformer has a second binocular core having a first leg, a second leg and a third leg.

12. The power splitter according to claim 11 wherein the first winding is wound on the middle leg.

13. The power splitter according to claim 11 wherein the second winding is wound on the middle leg.

14. The power splitter according to claim 11 wherein the second winding has four ends, two of the ends connected to the terminals and the other two ends connected to the leads.

15. The power splitter according to claim 10 wherein a portion of the transformers extend over the ends of the substrate.

16. The power splitter according to claim 10 wherein the transformers are attached to the bottom surface of the substrate using an adhesive.

17. The power splitter according to claim 10 wherein the cavity being openly exposed allows the power splitter to be cooled.

18. The power splitter according to claim 10 wherein the case is adapted to be grasped by an automated machine.

19. A method of manufacturing a power splitter package comprising the steps of:

a) providing a low temperature co-fired ceramic substrate having a resistor, a capacitor and a plurality of terminals;

b) providing a case having a cavity, a bottom surface and a plurality of leads extending from the case;

c) dispensing a first adhesive on the bottom surface of the case;

d) inserting a first and second transformer onto the first adhesive, the transformers having a plurality of windings;

e) curing the first adhesive;

f) dispensing a second adhesive onto the first and second transformers;

g) placing the substrate onto the second adhesive;

h) curing the second adhesive;

i) wire welding the windings to the terminals; and j) attaching a plurality of connecting wires between the leads and the terminals.

20. The method according to claim 19 wherein the power splitter package is attached to a printed circuit board, further comprising the steps of:

a) screening a solder paste onto the printed circuit board;

b) placing the power splitter package such that a distal end of the leads contacts the printed circuit board; and c) reflowing the solder paste such that the power splitter package is attached to the printed circuit board.

* * * * *